(12) United States Patent
Kaneko et al.

(10) Patent No.: US 8,935,850 B2
(45) Date of Patent: Jan. 20, 2015

(54) METHOD OF MANUFACTURING PRINTED WIRING BOARD

(71) Applicant: Ibiden Co., Ltd., Ogaki (JP)

(72) Inventors: Masahiro Kaneko, Ogaki (JP); Satoru Kose, Ogaki (JP); Hirokazu Higashi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/776,024

(22) Filed: Feb. 25, 2013

(65) Prior Publication Data

US 2013/0164440 A1 Jun. 27, 2013

Related U.S. Application Data

(62) Division of application No. 12/840,696, filed on Jul. 21, 2010, now Pat. No. 8,410,376.

(60) Provisional application No. 61/237,808, filed on Aug. 28, 2009.

(51) Int. Cl.
*H05K 3/02* (2006.01)
*H05K 3/10* (2006.01)
(Continued)

(52) U.S. Cl.
CPC ...... *H05K 1/113* (2013.01); *H01L 2225/06506* (2013.01); *H01L 2224/48227* (2013.01); *H01L 2924/01019* (2013.01); *H01L 2924/01029* (2013.01); *H01L 2924/01014* (2013.01); *H05K 3/388* (2013.01); *H01L 21/6835* (2013.01); *H01L 2924/01078* (2013.01); *H01L 2224/85385* (2013.01); *H01L 2924/01006* (2013.01); *H01L 2224/48145* (2013.01); *H05K 2201/09527* (2013.01); *H01L 25/0657* (2013.01); *H01L 2224/48091* (2013.01);
(Continued)

(58) Field of Classification Search
USPC ............ 29/846, 834, 847, 852; 174/251, 255, 174/257, 258, 260, 262, 266; 438/108, 123, 438/401, 424, 464, 599
See application file for complete search history.

(56) References Cited

U.S. PATENT DOCUMENTS 6,410,937 B1 6/2002 Taran et al.
6,709,962 B2 * 3/2004 Berg .............................. 438/599

(Continued)

FOREIGN PATENT DOCUMENTS

CN 101965097 A 2/2011
JP 2006-019433 1/2006

*Primary Examiner* — Thiem Phan
(74) *Attorney, Agent, or Firm* — Oblon, Spivak, McClelland, Maier & Neustadt, L.L.P.

(57) ABSTRACT

A method for manufacturing a printed wiring board includes forming a removable layer on a support substrate, forming an interlayer resin insulation layer on the removable layer, forming a penetrating hole in the interlayer resin insulation layer, forming a first conductive layer on the interlayer resin insulation layer and on a side wall of the penetrating hole, forming a conductive circuit on the interlayer resin insulation layer, forming a via conductor in the penetrating hole, removing the support substrate from the interlayer resin insulation layer by using the removable layer, forming a protruding portion of the via conductor protruding from a surface of the interlayer resin insulation layer, and forming a surface-treatment coating on a surface of the protruding portion of the via conductor.

20 Claims, 15 Drawing Sheets

(51) Int. Cl.
*H05K 1/11* (2006.01)
*H01L 21/683* (2006.01)
*H01L 25/065* (2006.01)
*H01L 23/498* (2006.01)
*H01L 23/00* (2006.01)
*H05K 3/38* (2006.01)
*H05K 3/00* (2006.01)

(52) U.S. Cl.
CPC .......... *H01L 2224/484* (2013.01); *H05K 3/108* (2013.01); *H01L 2225/0651* (2013.01); *H01L 2924/01079* (2013.01); *H01L 2224/73265* (2013.01); *H01L 2224/45144* (2013.01); *H01L 2924/3025* (2013.01); *H01L 2924/01046* (2013.01); *H05K 2201/09563* (2013.01); *H01L 2224/83385* (2013.01); *H01L 2224/48235* (2013.01); *H01L 2924/15311* (2013.01); *H01L 2224/85001* (2013.01); *H01L 2924/12041* (2013.01); *H01L 23/49827* (2013.01); *H01L 2224/85444* (2013.01); *H01L 2924/01033* (2013.01); *H01L 23/49866* (2013.01); *H01L 2224/32057* (2013.01); *H01L 2224/48599* (2013.01); *H01L 2224/32225* (2013.01); *H01L 2924/04941* (2013.01); *H05K 2201/09509* (2013.01); *H01L 2224/32145* (2013.01); *H01L 2924/01005* (2013.01); *H01L 2924/01082* (2013.01); *H01L 2924/01028* (2013.01); *H01L 2221/68345* (2013.01); *H05K 3/007* (2013.01); *H01L 2924/014* (2013.01); *H01L 2924/0105* (2013.01); *H01L 2225/06562* (2013.01); *H01L 24/48* (2013.01); *H01L 23/49816* (2013.01)
USPC .................. 29/846; 29/847; 29/852; 438/424; 438/464; 438/599

(56) References Cited

U.S. PATENT DOCUMENTS

| | | | |
|---|---|---|---|
| 7,935,893 B2* | 5/2011 | Tanaka et al. | 174/260 |
| 7,985,663 B2* | 7/2011 | Sato et al. | 438/464 |
| 2005/0251997 A1 | 11/2005 | Homg et al. | |
| 2006/0202344 A1 | 9/2006 | Takada et al. | |
| 2009/0298228 A1 | 12/2009 | Sato et al. | |
| 2011/0067913 A1 | 3/2011 | Kaneko et al. | |
| 2012/0080786 A1 | 4/2012 | Furutani et al. | |

* cited by examiner

FIG. 1
(A)
(B)
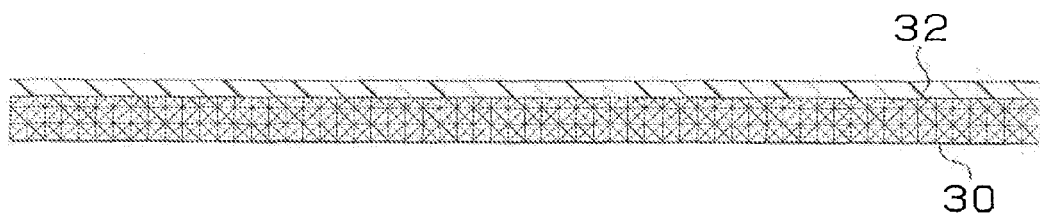
(C)
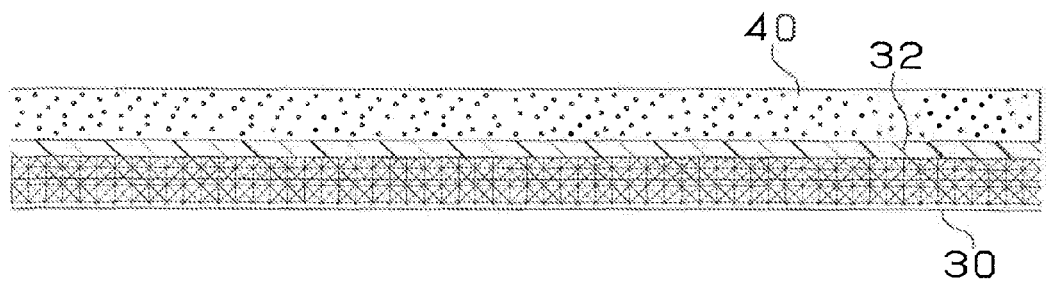

FIG. 2
(A)
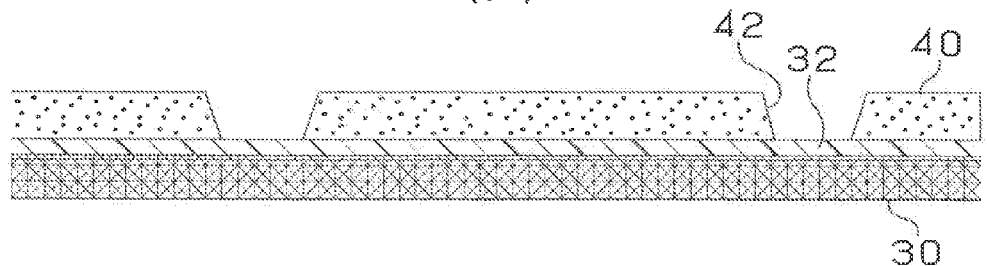
(B)
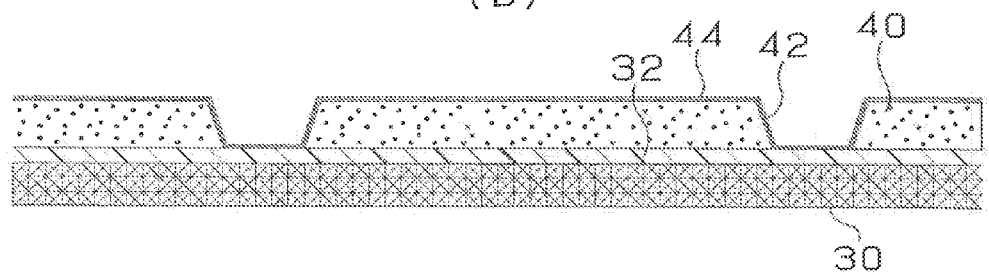
(C)
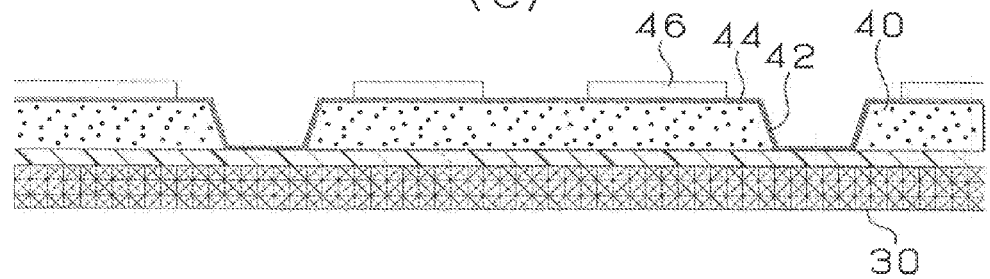

FIG. 3
(A)
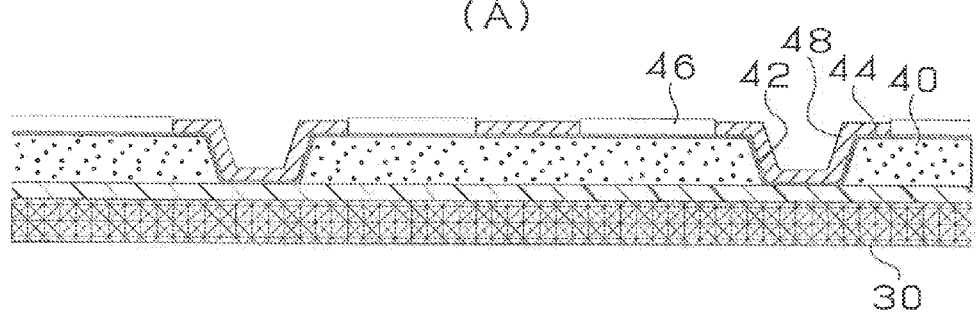
(B)
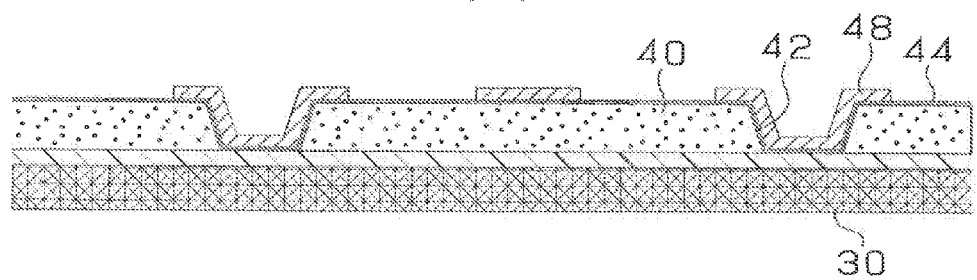
(C)
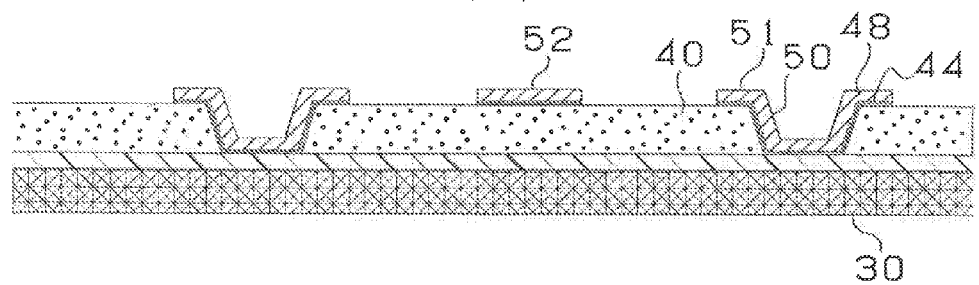
(D)
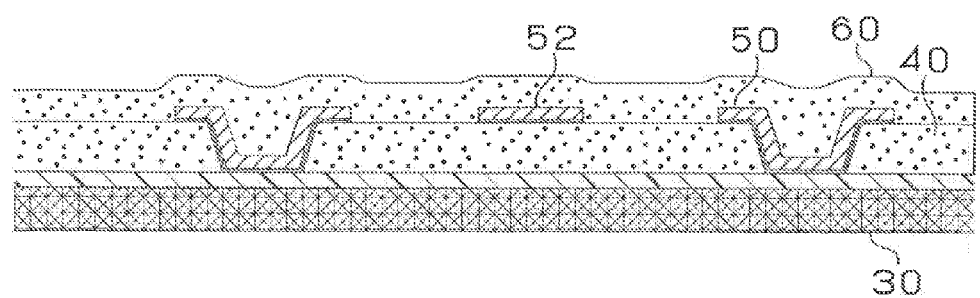

FIG. 5
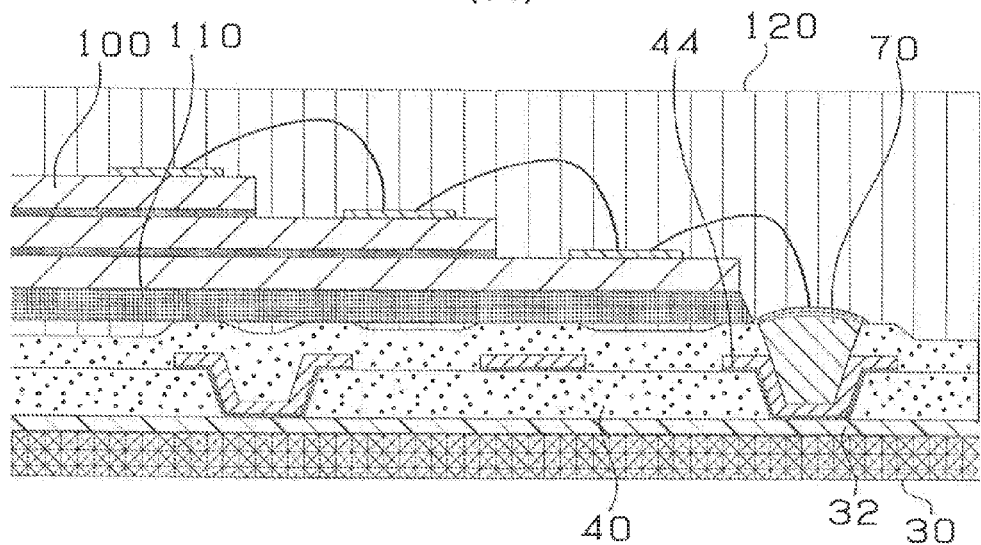
(A)
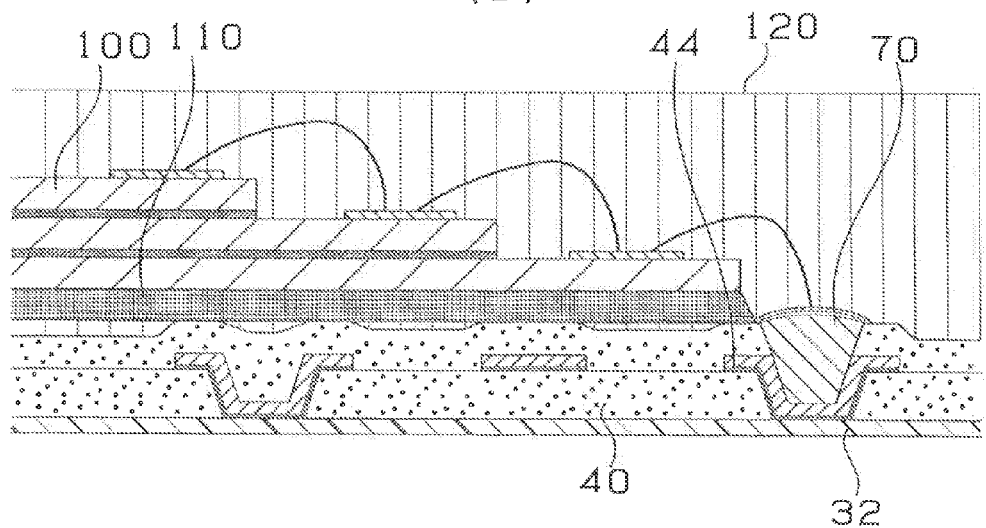
(B)

FIG. 14
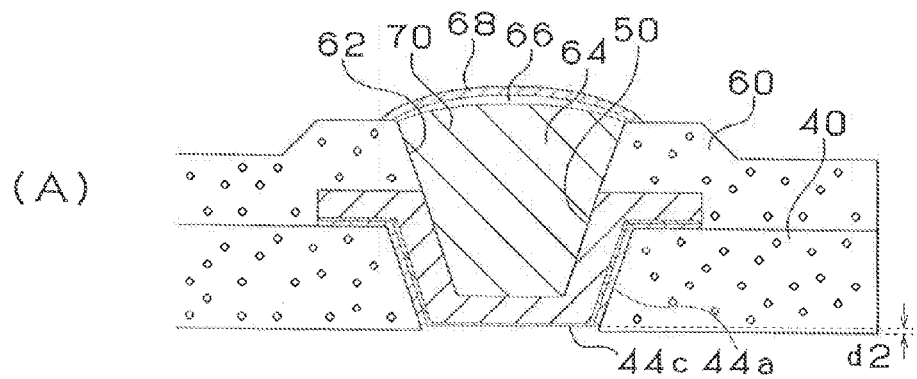
(A)
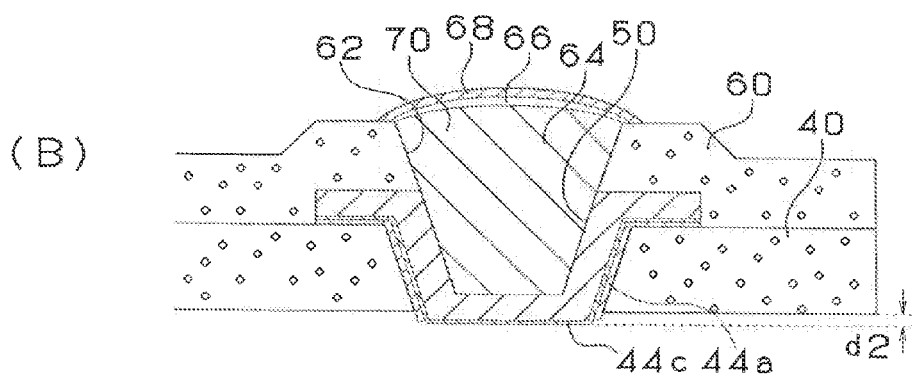
(B)
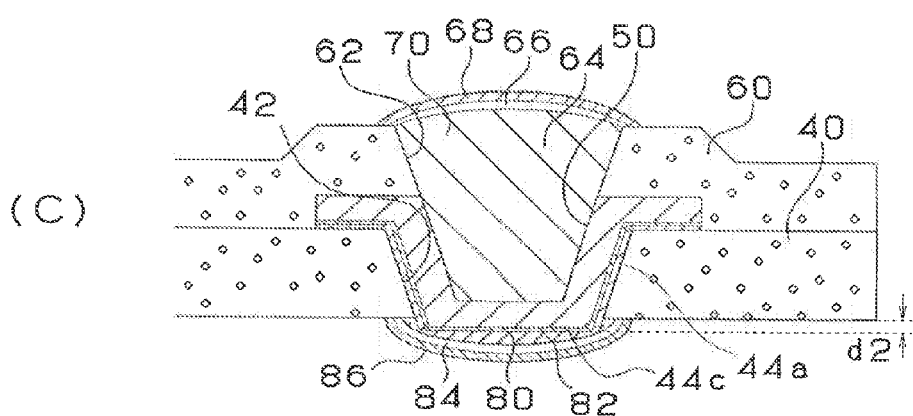
(C)

METHOD OF MANUFACTURING PRINTED WIRING BOARD

CROSS-REFERENCE TO RELATED APPLICATIONS

The present application is a divisional of and claims the benefit of priority under 35 U.S.C. §120 from U.S. Ser. No. 12/840,696, filed Jul. 21, 2010, which is based on and claims the benefit of priority from U.S. Application No. 61/237,808, filed Aug. 28, 2009. The entire contents of these applications are incorporated herein by reference.

BACKGROUND OF THE INVENTION

1. Field of the Invention

The present invention relates to a super-thin printed wiring board which can be preferably used in an SSD or the like to mount multiple flash memories, and to a method for manufacturing such a printed wiring board.

2. Discussion of the Background

Japanese Laid-Open Patent Publication 2006-19433 describes a manufacturing method which aims to provide a thin-type wiring board, for example. In the manufacturing method, an insulation layer is formed on a silicon substrate, and a via conductor is formed in the insulation layer. After that, a wiring layer is formed on the via conductor, and a semiconductor element is mounted on the wiring layer and encapsulated with resin. Then, a wiring board is obtained by removing the silicon substrate. The contents of this publication are incorporated herein by reference in their entirety.

SUMMARY OF THE INVENTION

According to one aspect of the present invention, a printed wiring board includes an interlayer resin insulation layer having a penetrating hole for a via conductor, a conductive circuit formed on one surface of the interlayer resin insulation layer, a via conductor formed in the penetrating hole and having a protruding portion protruding from the other surface of the interlayer resin insulation layer, and a surface-treatment coating formed on the surface of the protruding portion of the via conductor. The via conductor is connected to the conductive circuit and has a first conductive layer formed on the side wall of the penetrating hole and a plated layer filling the penetrating hole.

According to another aspect of the present invention, a method for manufacturing a printed wiring board includes forming a removable layer on a support substrate, forming an interlayer resin insulation layer on the removable layer, forming a penetrating hole in the interlayer resin insulation layer, forming a first conductive layer on the interlayer resin insulation layer and on a side wall of the penetrating hole, forming a conductive circuit on the interlayer resin insulation layer, forming a via conductor in the penetrating hole, removing the support substrate from the interlayer resin insulation layer by using the removable layer, forming a protruding portion of the via conductor protruding from a surface of the interlayer resin insulation layer, and forming a surface-treatment coating on a surface of the protruding portion of the via conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1(A)-1(C) are views of the steps for manufacturing a printed wiring board according to the first embodiment of the present invention;

FIGS. 2(A)-2(C) are views of the steps for manufacturing a printed wiring board according to the first embodiment;

FIGS. 3(A)-3(D) are views of the steps for manufacturing a printed wiring board according to the first embodiment;

FIGS. 5(A)-5(B) are views of the steps for manufacturing a printed wiring board according to the first embodiment;

FIGS. 14(A)-14(C) are views of the manufacturing steps shown by magnifying a via conductor and a bump in a printed wiring board of the second embodiment.

DETAILED DESCRIPTION OF THE EMBODIMENTS

Figure 4:
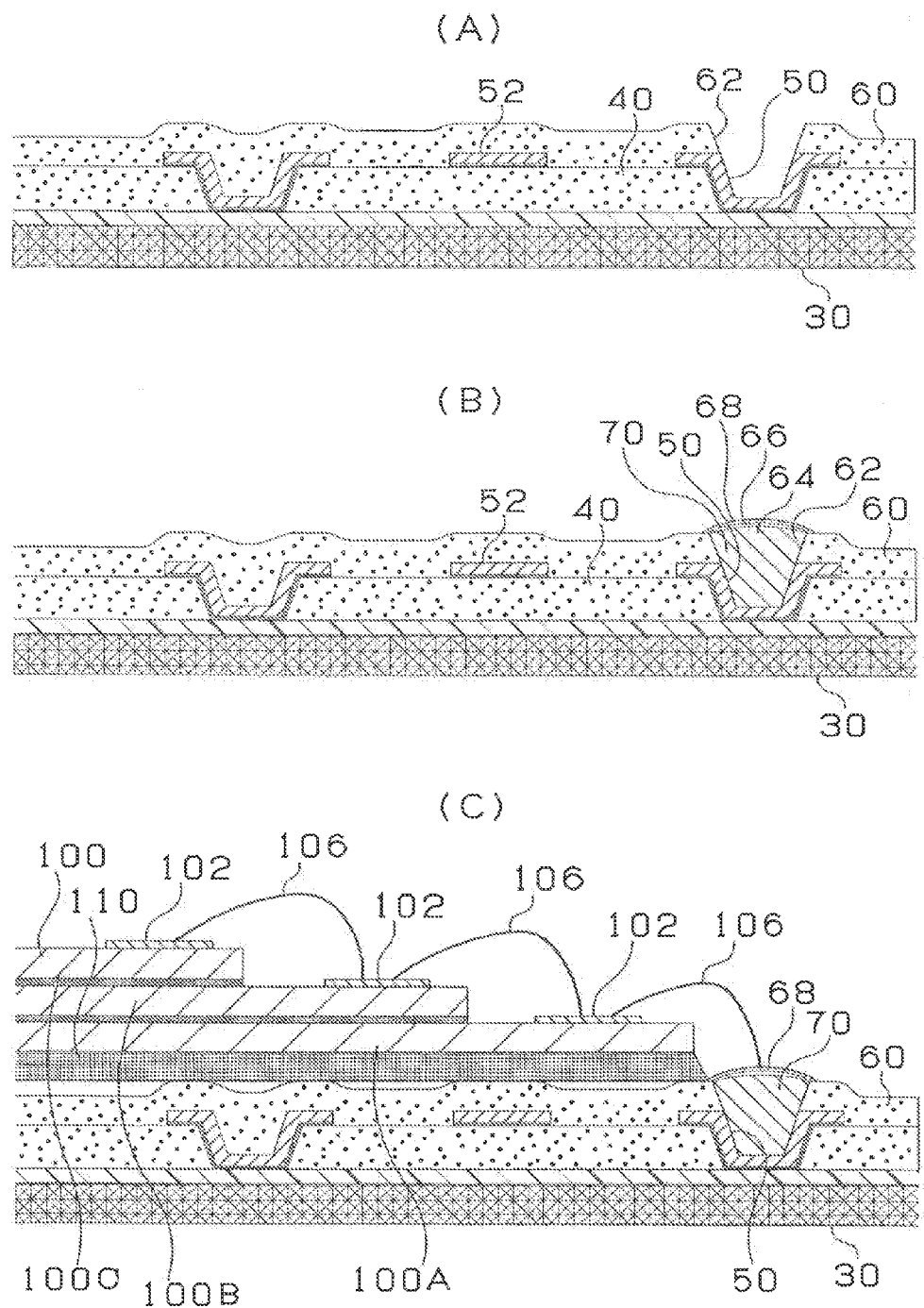
FIGS. 4(A)-4(C) are views of the steps for manufacturing a printed wiring board according to the first embodiment.
Figure 6:
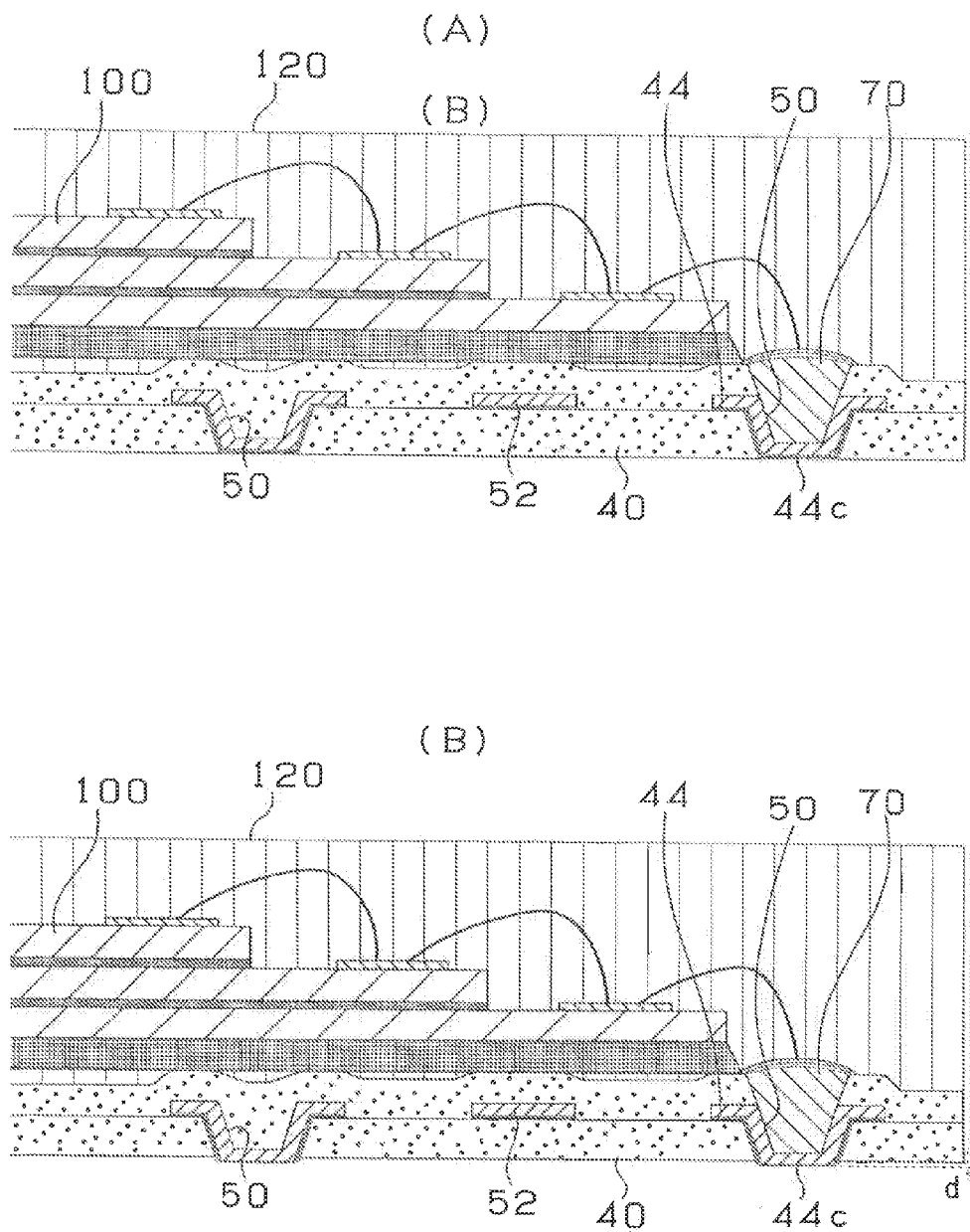
FIGS. 6(A)-6(B) are views of the steps for manufacturing a printed wiring board according to the first embodiment.

The embodiments will now be described with reference to the accompanying drawings, wherein like reference numerals designate corresponding or identical elements throughout the various drawings.

First Embodiment

A printed wiring board according to the first embodiment of the present invention and a method for manufacturing such a printed wiring board are described with reference to FIGS. 1-9.

Figure 7:
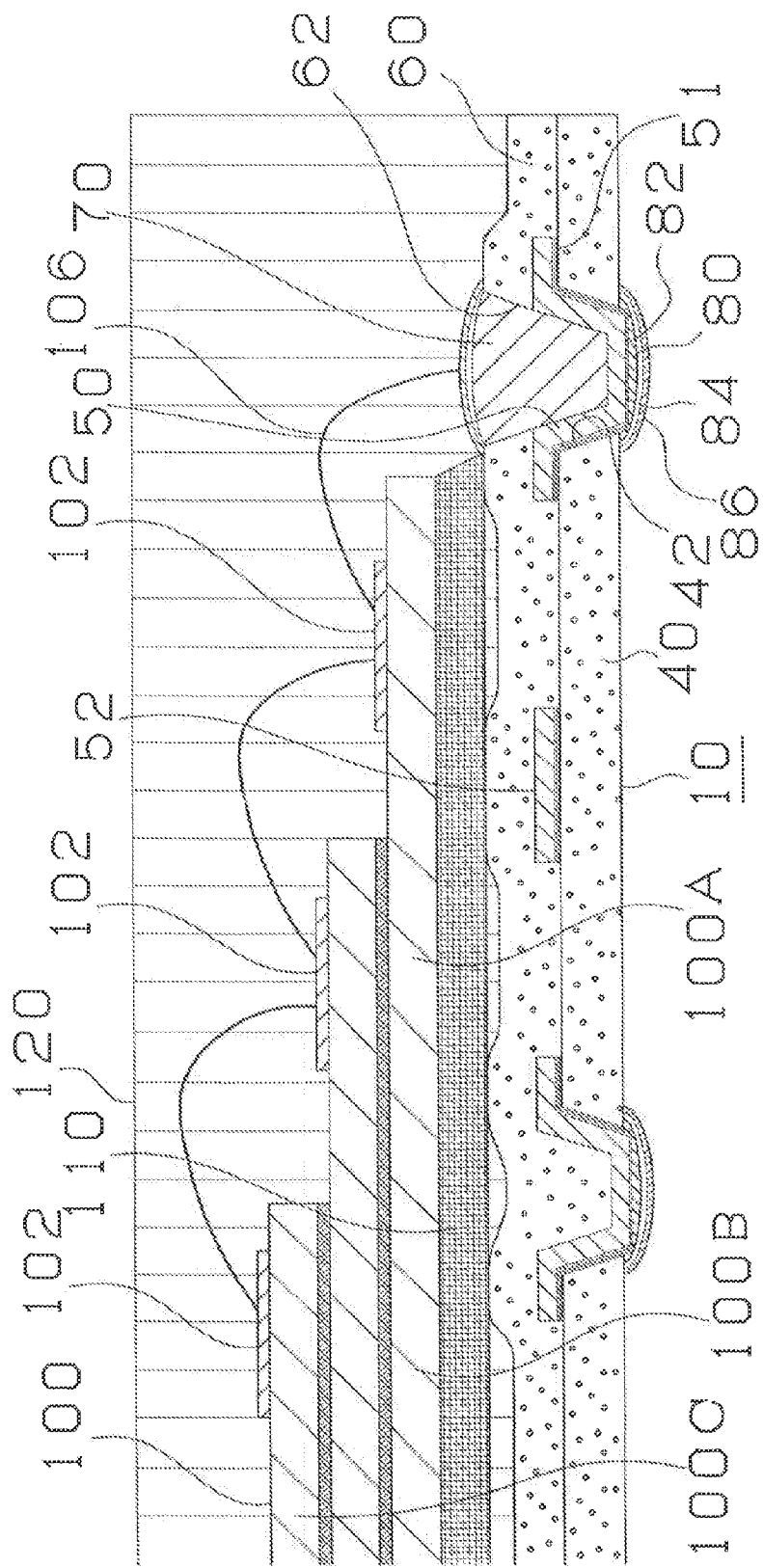
FIG. 7 is a cross-sectional view showing a printed wiring board of the first embodiment.
Figure 8:
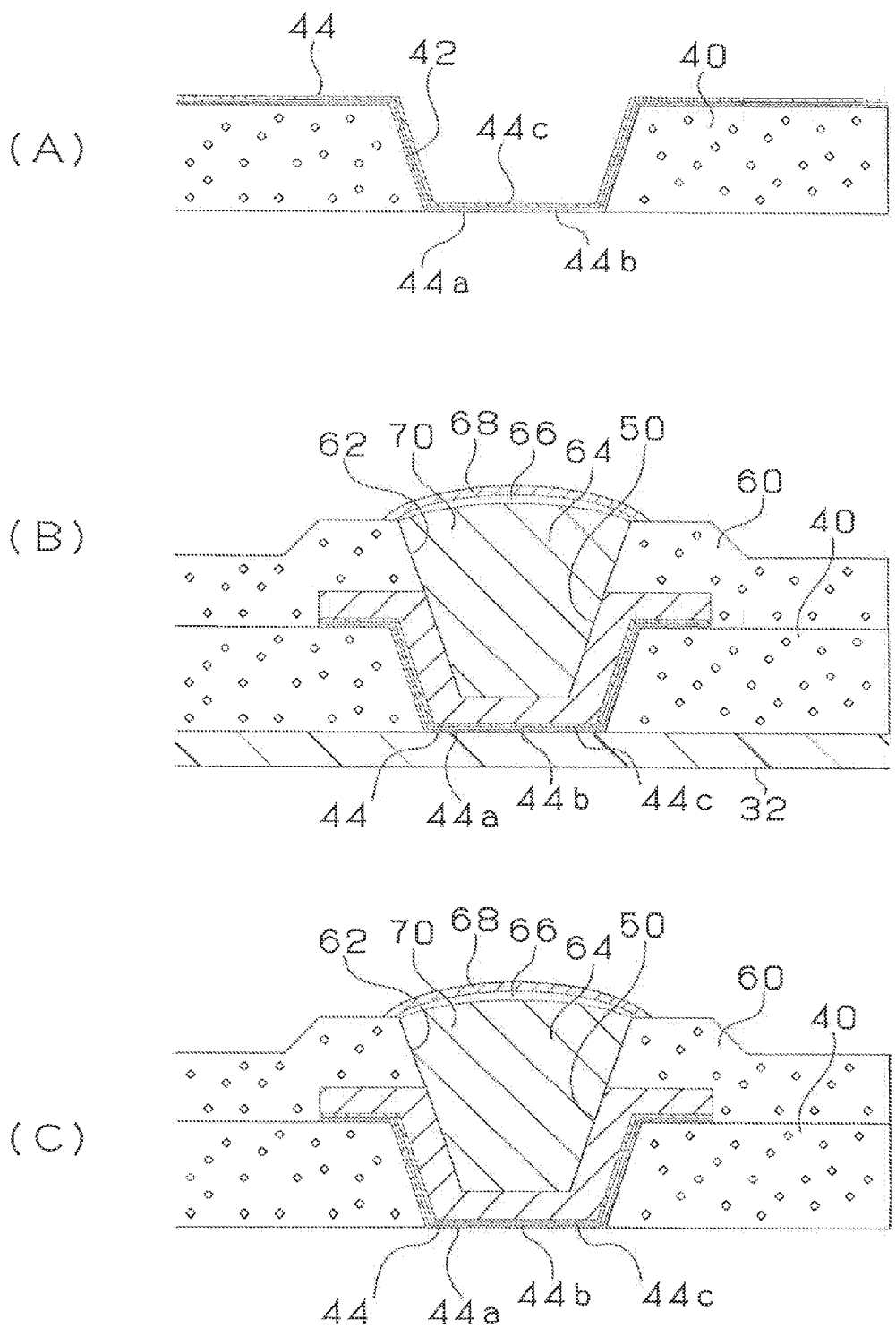
FIGS. 8(A)-8(C) are cross-sectional views showing a printed wiring board of the first embodiment.
Figure 9:
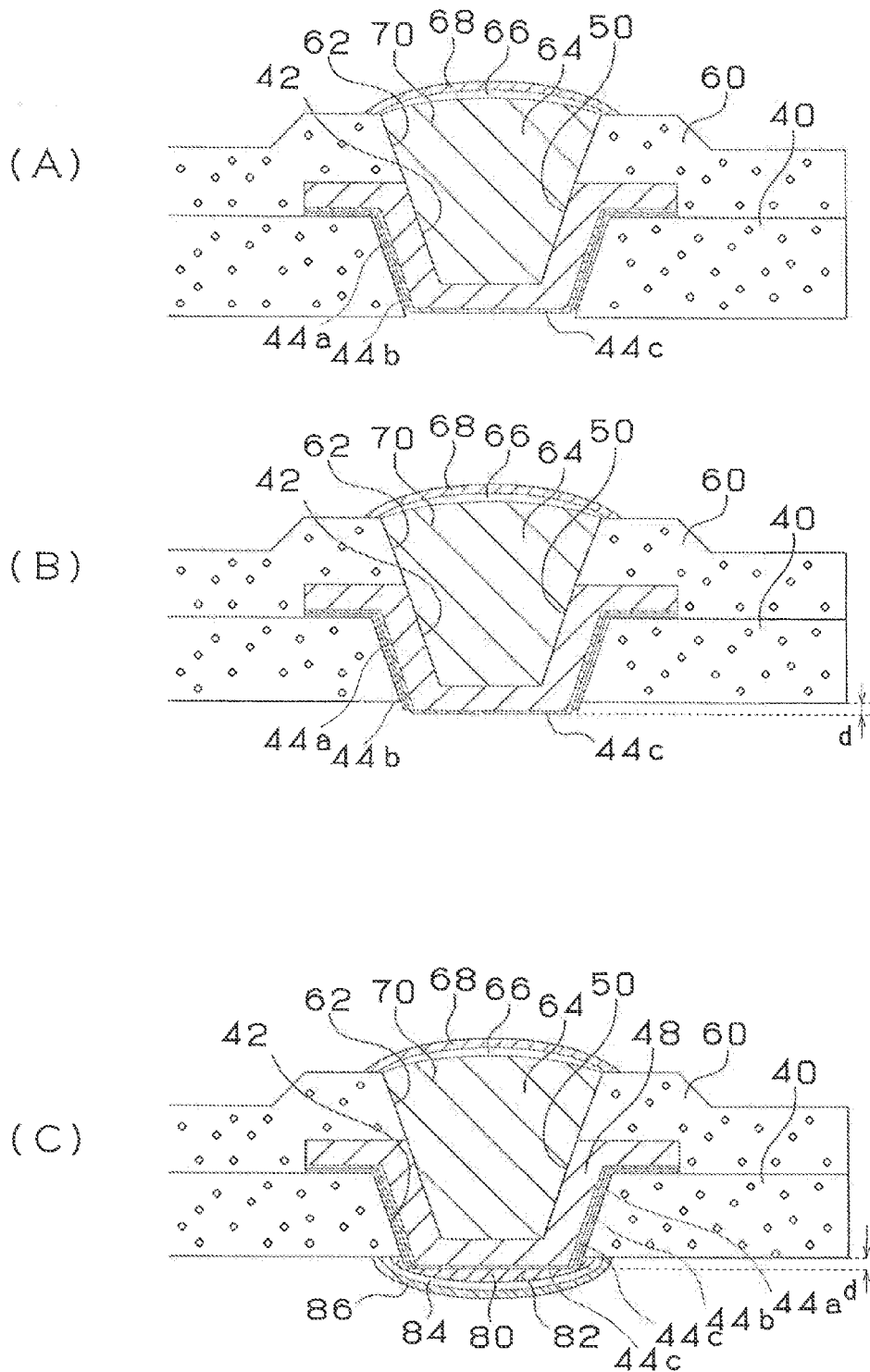
FIGS. 9(A)-9(C) are views of the manufacturing steps shown by magnifying a via conductor and a bump in a printed wiring board of the first embodiment.

FIG. 7 is a cross-sectional view showing part of printed wiring board 10. In printed wiring board 10, memory laminate 100 made by laminating multiple sheets of memories (100A, 100B, 100C) is mounted. Memory laminate 100 is fixed to printed wiring board 10 by means of adhesive layer 110. The memories of memory laminate 100 are connected to each other by wires 106, for example. The memories may also be connected to each other by wiring formed by inkjet.

Printed wiring board 10 has a double-layer structure of first interlayer resin insulation layer 40 and second interlayer resin insulation layer 60. In opening 42 formed in first interlayer resin insulation layer 40, via conductor 50 is formed. On first interlayer resin insulation layer, conductive circuit 52 and via land 51 are formed. Opening 62 is formed in second interlayer resin insulation layer 60, and surface-treatment coating 70 is formed in opening 62. Printed wiring board 10 and memory laminate 100 are connected by wire 106 spanning between surface-treatment coating 70 of printed wiring board 10 and pad 102 of memory laminate 100. On the lower-surface side (first-surface side) of via conductor 50, surface-treatment coating 80 for external connection is formed to have a structure that enables wire bonding. Memory laminate 100 is encapsulated with molding resin 120.

FIG. 9C shows a magnified view of the area surrounding via conductor 50 in FIG. 7. Surface-treatment coating 70 on via conductor 50 is formed with Ni-plated material 64 which is filled in opening 62 in second interlayer resin insulation layer 60, Pd film 66 on Ni-plated material 64 and Au film 68 on Pd film 66. Au film 68 is coated for the purposes of preventing corrosion of the conductive circuit and of allowing wire 106 made of a gold wire to make easy bonding.

On the side wall of opening 42 in first interlayer resin insulation layer 40, TiN-sputtered film (44a) (first conductive layer), Ti-sputtered film (44b) (first conductive layer) and Cu-sputtered film (44c) (second conductive layer) are formed in that order. Namely, via conductor 50 is formed with TiN-sputtered film (44a), Ti-sputtered film (44b), Cu-sputtered film (44c) and electrolytic copper-plated film 48 formed on the inner side of Cu-sputtered film (44c). TiN-sputtered film (44a) and Ti-sputtered film (44b) are removed from the bottom-surface side (first-surface side) of via conductor 50, and surface-treatment coating 80 is formed on the surface of Cu-sputtered film (44c). Surface-treatment coating 80 is formed with Ni film 82 formed on the first surface of via conductor 50, Pd film 84 on Ni film 82 and Au film 86 on Pd film 84.

Figure 10:
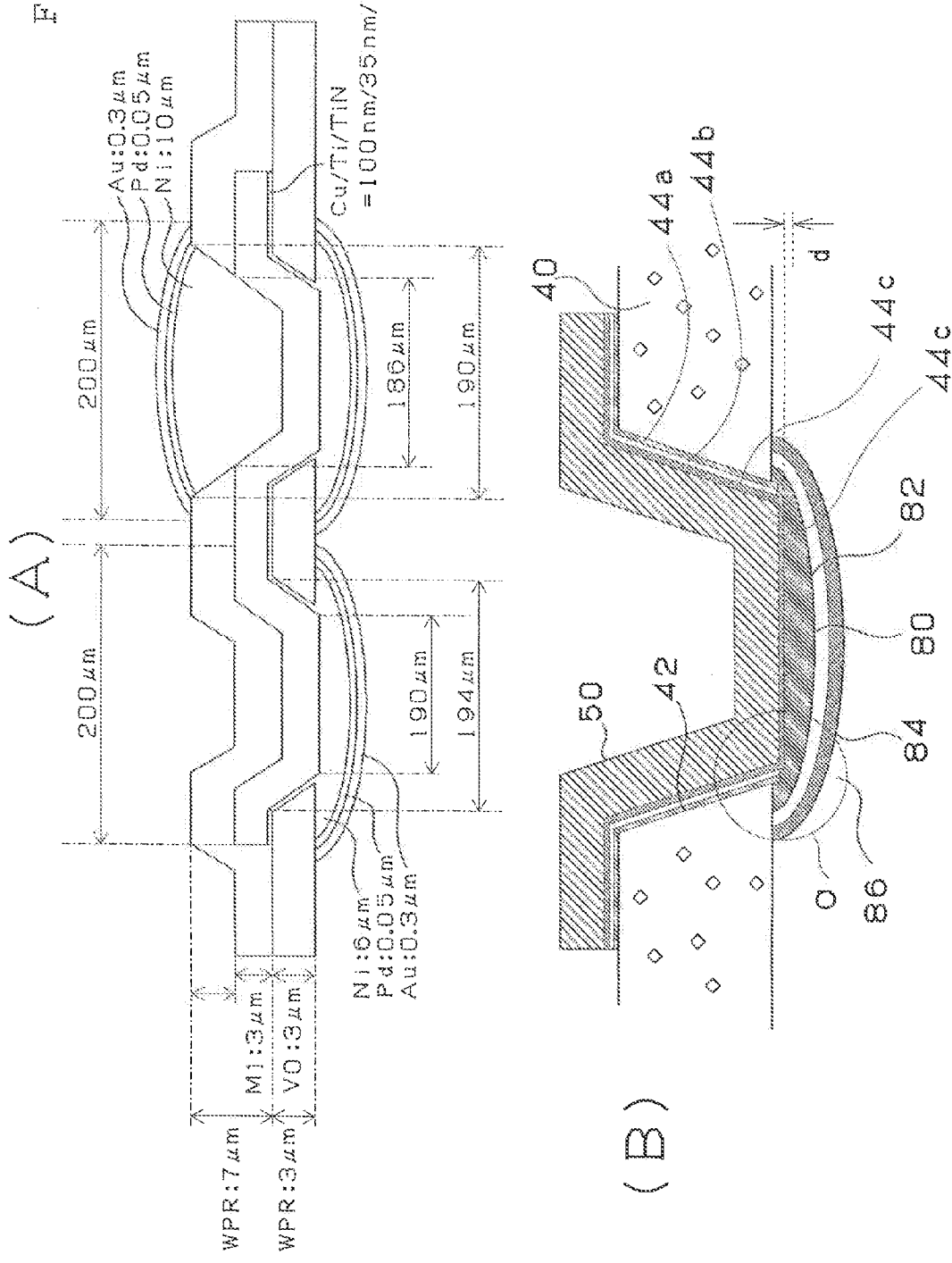
FIGS. 10(A)-10(B) are views illustrating a via conductor in a printed wiring board of the first embodiment.
Figure 11:
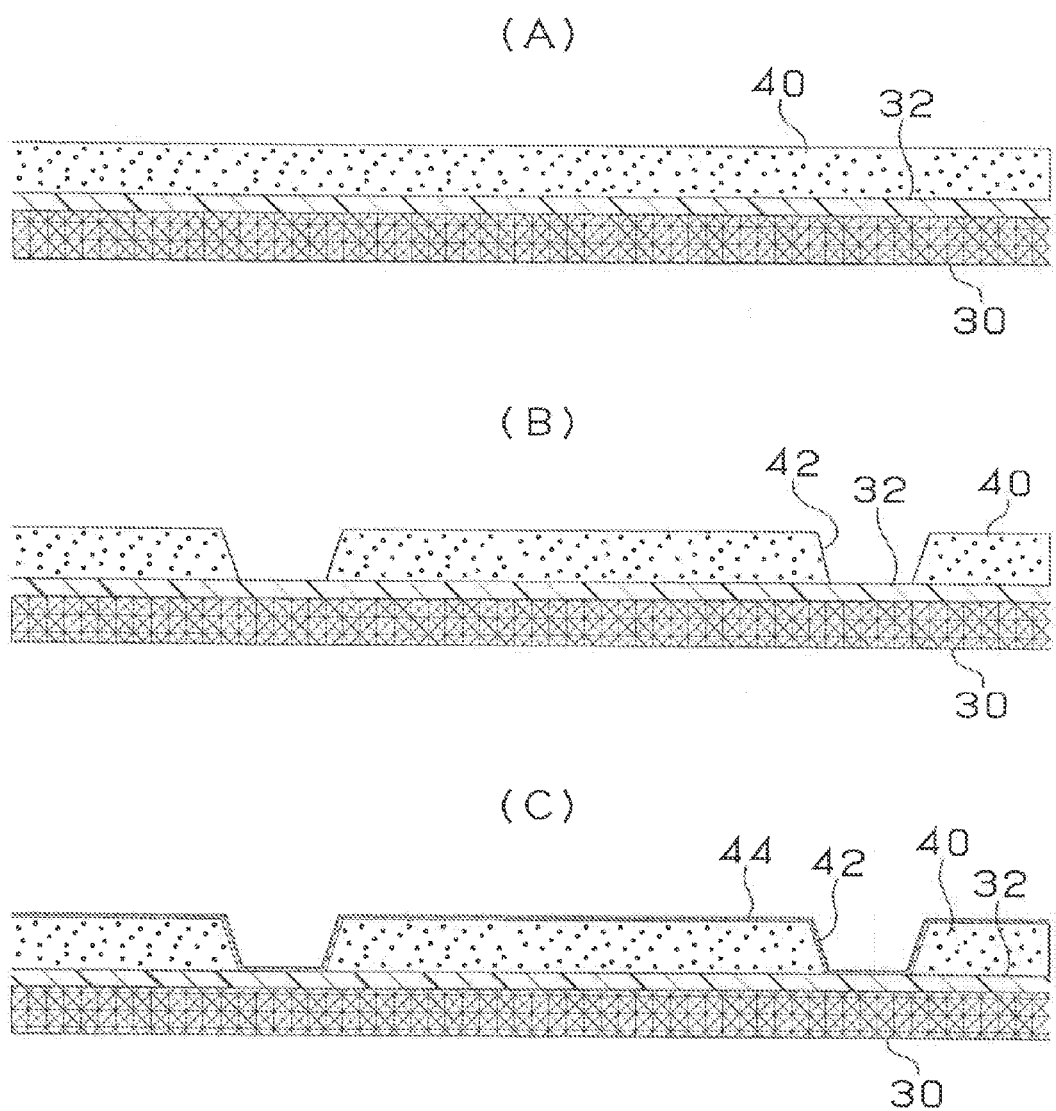
FIGS. 11(A)-11(C) are views of the steps for manufacturing a printed wiring board according to the second embodiment of the present invention.

The film thickness of each layer is shown in FIG. 10A. The first interlayer resin insulation layer and the second interlayer resin insulation layer are formed to be approximately 3 μm thick. The Ni-plated layer forming surface-treatment coating 70 is formed to be approximately 10 μm thick. The Pd film on the Ni-plated layer is formed to be approximately 0.05 μm, and the Au film on the Pd film approximately 0.3 μm. Meanwhile, the Cu-sputtered film formed on the side wall of a via-conductor opening is formed to be approximately 100 nm, the Ti-sputtered film approximately 35 nm, and the TiN-sputtered film approximately 15 nm. The Ni-sputtered layer forming surface-treatment film 80 is formed to be approximately 6 μm, the Pb layer approximately 0.05 μm and the Au layer approximately 0.3 μm.

As described above, Ti-sputtered film (44b) and TiN-sputtered film (44a) are removed from the bottom-surface side of via conductor 50, and the surface of Cu-sputtered film (44c) protrudes by distance (d) (50 μm) from the second surface of first interlayer resin insulation layer 40 (see FIG. 10B).

In a printed wiring board according to the first embodiment, since the bottom surface of via conductor 50 protrudes by (d) (50 μm) from the bottom surface of first interlayer resin insulation layer 40, an anchoring effect is achieved with surface-treatment coating 80 formed on via conductor 50, and adhesiveness is improved between via conductor 50 and surface-treatment coating 80.

Here, when the base (the first-surface side of via conductor 50) for forming surface-treatment coating 80 is a sputtered film, such a film will show barrier functions because of its fine crystallization and suppress copper ions forming the via conductor from being diffused into surface-treatment coating 80. Thus, the adhesive strength of surface-treatment coating 80 is ensured. However, even if surface-treatment coating 80 formed by electrolytic plating is made from the same metal as the sputtered film (Cu-sputtered film (44c)), their crystallization structures are different. In addition, since a sputtered film (Cu-sputtered film (44c)) has a flat surface compared with a plated film, surface-treatment coating 80 may possibly be removed from via conductor 50, for example, at the time of wire bonding or when heat is generated in the module. Therefore, in the present embodiment, the first-surface side of via conductor 50 is made to protrude from the second surface of first interlayer resin insulation layer 40. Therefore, even if the base (the first-surface side of via conductor 50) for forming surface-treatment coating 80 is a sputtered film, adhesiveness is ensured between via conductor 50 and surface-treatment coating 80.

In the following, a method is described for manufacturing a printed wiring board according to the first embodiment.

First, on support substrate 30 shown in FIG. 1A, 3 μm-thick thermoplastic resin (HT250, made by Nissan Chemical Industries, Ltd.) 32 is laminated (FIG. 1B). Then, 4 μm-thick interlayer resin insulation layer (brand name: WPR, made by JSR Corp.) 40 is laminated on thermoplastic resin 32 (FIG. 1C).

Using a photolithographic technique, via opening 42 with an approximate diameter of 200 μm is formed at a predetermined spot (FIG. 2A). On the surface of interlayer resin insulation layer 40, including the interior of via opening 42, three-layer shield layer 44 is formed by sputtering (FIG. 2B). The structure of such a shield layer is described in further detail by referring to a magnified view of opening 42 in FIG. 8A. Shield layer 44 is made of TiN-sputtered film (44a), Ti-sputtered film (44b) and Cu-sputtered film (44c). Since TiN-sputtered film (44a), Ti-sputtered film (44b) and Cu-sputtered film (44c) are formed by sputtering, they are each flat and thin, and are highly adhesive to each other.

By applying a commercially available resist on interlayer resin insulation layer 40 coated with shield layer 44, then by conducting exposure and development, plating resist 46 with a predetermined pattern is formed (FIG. 2C). Then, by performing electrolytic plating, electrolytic copper-plated film 48 is formed on areas where the plating resist is not formed (FIG. 3A). Here, since electrolytic copper-plated film 48 is formed on Cu-sputtered film (44c) using copper as well, adhesiveness is high between shield layer 44 and electrolytic copper-plated film 48. By removing the plating resist (FIG. 3B), and by removing shield layer 44 under the plating resist using quick etching, via conductor 50 is formed in opening 42, and conductive circuit 52 and via land 51 are formed on interlayer resin insulation layer 40 (FIG. 3C). When forming two or more wiring layers, via conductor 50 is preferred to be a filled via. By forming via conductor 50 as a filled via, the surface of via conductor 50 becomes substantially flat. In cases of a printed wiring board having a multilayer wiring structure, it is possible to arrange a via conductor directly on via conductor 50. Thus, highly integrated wiring may be achieved.

On first interlayer resin insulation layer 40 with conductive circuit 52, 4 μm-thick interlayer resin insulation layer (brand name: WPR, made by JSR Corp.) 60 is laminated (FIG. 3D). Using a photolithographic technique, opening 62 with a diameter of 200 μm is formed on a predetermined via conductor (FIG. 4A). Then, on via conductor 50 exposed through opening 62, Ni-plated layer 64, Pd-plated layer 66 and Au-plated layer 68 are formed in that order by electroless plating (FIG. 4B).

On interlayer resin insulation layer 60, memory laminate 100 made by laminating memories (100A, 100B, 100C) is mounted by means of adhesive layer 110, and pad 102 of memory laminate 100 and surface-treatment coating 70 (via conductor 50) are connected using wire 106 (FIG. 4C).

Interlayer resin insulation layer 60 and memory laminate 100 are encapsulated by molding resin 120 (FIG. 5A). After that, heat is added and support substrate 30 is removed by sliding it using thermoplastic resin 32 (FIG. 5B). FIG. 8B shows a magnified view of via conductor 50 after support substrate 30 is removed. Thermoplastic resin 32 is removed by ashing (FIG. 6A, and FIG. 8C which is a magnified view of FIG. 6A). Etching is conducted using an etchant containing KOH to remove Ti-sputtered film (44b) and TiN-sputtered film (44a) exposed through opening 42 in interlayer resin insulation layer 40. Here, Ti is easy to dissolve by KOH, but Cu is difficult to dissolve. FIG. 9A shows a magnified view of via conductor 50 after Ti-sputtered film (44b) and TiN-sputtered film (44a) exposed through opening 42 are removed.

Then, the surface of first interlayer resin insulation layer 40 is polished by sandblasting to reduce the thickness by (d) (50 μm) (FIG. 6B, and FIG. 9B which is a magnified view of FIG. 6B). As described above with reference to FIG. 10B, the surface of Cu-sputtered film (44c) protrudes by distance (d) (50 μm) from the second surface of first interlayer resin insulation layer 40.

Then, after forming Ni film 82 by electroless plating on Cu-sputtered film (44c) on the bottom of via conductor 50, Pb film 84 and Au film 86 are formed in that order by electroless plating, and surface-treatment coating 80 is formed (FIG. 7). FIG. 9C shows a magnified view of surface-treatment coating 80 in FIG. 7.

A semiconductor apparatus manufactured as above is mounted on a motherboard by means of wires or solder bumps. Here, a multiple number of such semiconductor apparatuses may be laminated and then mounted on a motherboard. In doing so, for example, when mounting 16-tiered memories on a motherboard, it becomes feasible to use only good semiconductor apparatuses obtained by mounting 4-tiered memories on a printed wiring board as above, and productivity will increase.

Second Embodiment

A printed wiring board according to the second embodiment of the present invention and a method for manufacturing such a printed wiring board are described with reference to FIGS. 11-14.

Figure 12:
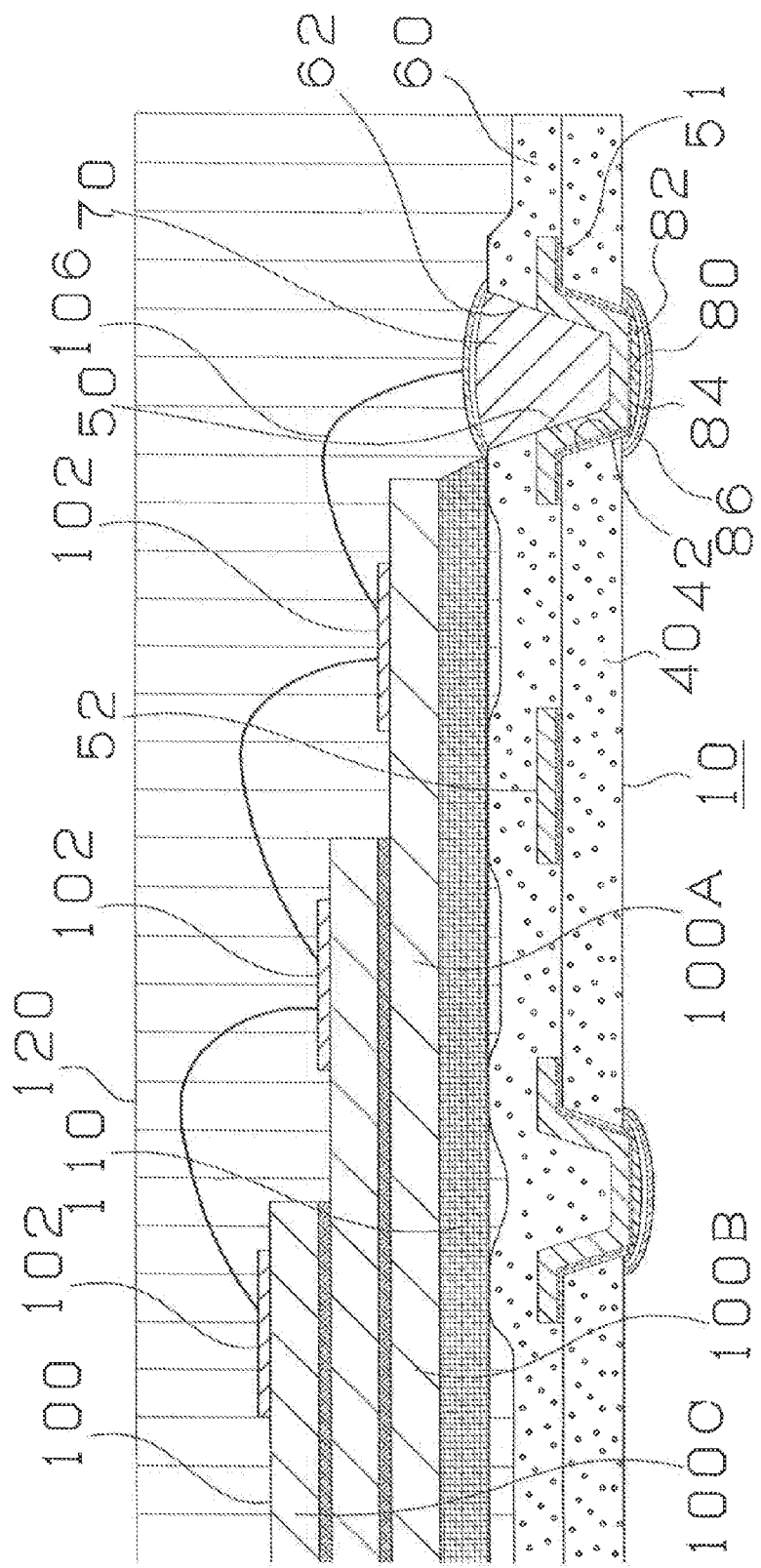
FIG. 12 is a cross-sectional view showing a printed wiring board of the second embodiment.
Figure 13:
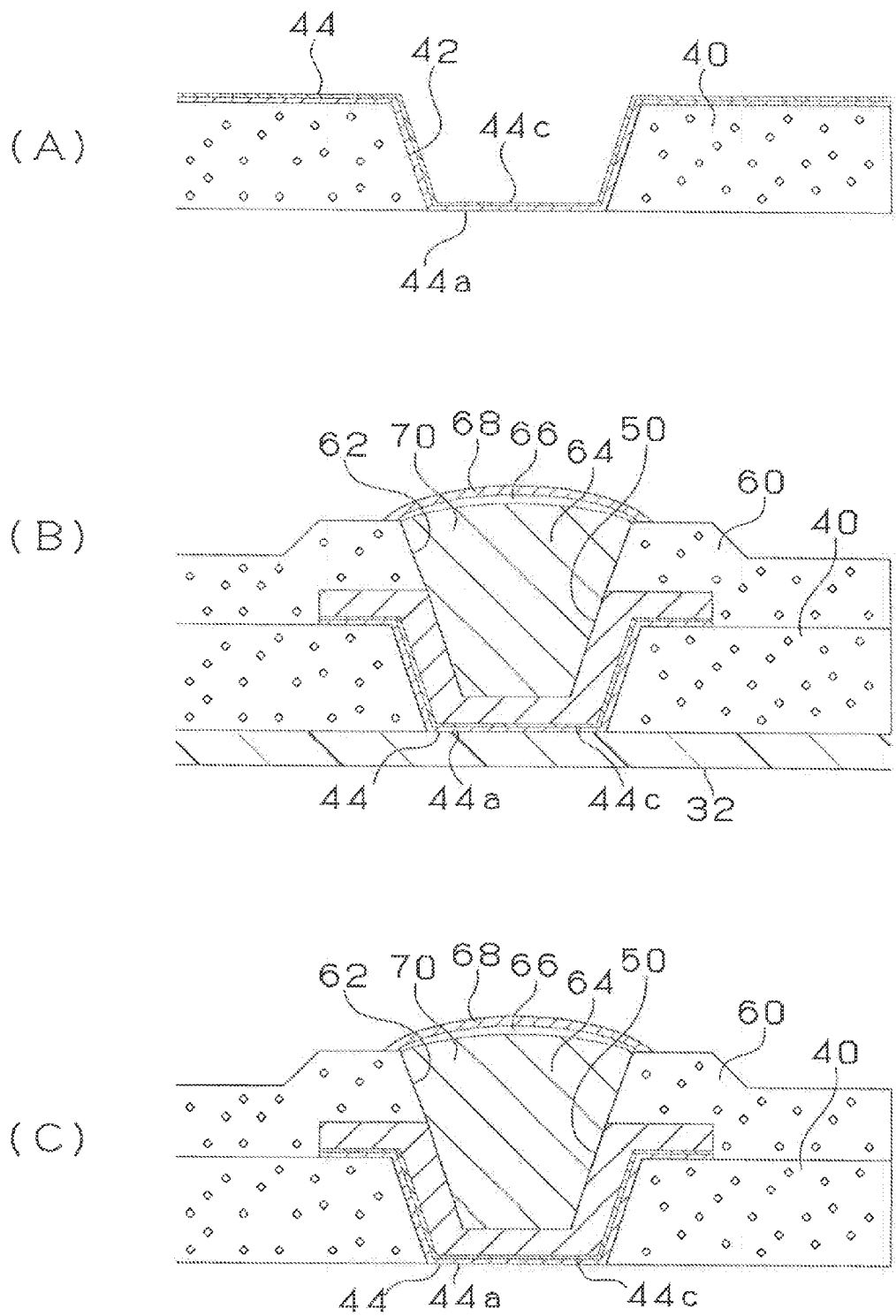
FIGS. 13A-13C are cross-sectional views showing a printed wiring board of the second embodiment.

FIG. 12 is a cross-sectional view showing part of printed wiring board 10. Printed wiring board 10 of the second embodiment is structured the same as in the first embodiment described above by referring to FIG. 7. However, in the first embodiment, three layers, Cu-sputtered film (44c), Ti-sputtered film (44b) and TiN-sputtered film (44a), were formed on the side wall of opening 42 in interlayer resin insulation layer 40. By contrast, in the second embodiment, as shown in FIG. 14C which is a magnified view of via conductor 50 in FIG. 12, a two-layer structure is employed where two layers made of TiN-sputtered film (44a) (first conductive layer) and Cu-sputtered film (44c) (second conductive layer) are formed on the side wall of opening 42.

In a printed wiring board of the second embodiment, since the bottom surface of via conductor 50 protrudes by 50 μm (d2) from the second surface of first interlayer resin insulation layer 40, an anchoring effect is achieved with surface-treatment coating 80 formed on via conductor 50, and adhesiveness is improved between via conductor 50 and surface-treatment coating 80.

In the following, a method for manufacturing a printed wiring board of the second embodiment is described.

As described above by referring to FIGS. 1-2A, thermoplastic resin 32 is formed on silicon substrate 30 and interlayer resin insulation layer 40 is laminated on thermoplastic resin 32 (FIG. 11A). Via opening 42 with a diameter of 200 μm is formed at a predetermined spot (FIG. 11B). Two-layer shield layer 44 is formed by sputtering on the surface of interlayer resin insulation layer 40, including the interior of via opening 42 (FIG. 11C). The structure of such a shield layer is described in further detail by referring to a magnified view of opening 42 shown in FIG. 13A. Shield layer 40 is made of TiN sputtered film (44a) and Cu-sputtered film (44c).

In the following, a printed wiring board is formed the same as in the first embodiment described above by referring to FIGS. 2C-5B, and interlayer resin insulation layer 60 and memory laminate 100 are encapsulated by molding resin 120. After that, heat is added and silicon substrate 30 is removed using thermoplastic resin 32 (FIG. 13B), and then thermoplastic resin 32 is removed by ashing (FIG. 13C). Etching is conducted using KOH to remove TiN-sputtered film (44a) exposed through opening 42 in interlayer resin insulation layer 40 (FIG. 14A).

The surface of first interlayer resin insulation layer 40 is polished by sandblasting to reduce the thickness by (d2) (50 μm) (FIG. 14B). As described above with reference to FIG. 14C, the surface of Cu-sputtered film (44c) protrudes by distance (d) (50 μm) from the second surface of first interlayer resin insulation layer 40.

Then, Ni film 82 is formed by sputtering on Cu-sputtered film (44c) on the bottom portion of via conductor 50. After that, by coating Pb film 84 and Au film 86 through electroless plating, surface-treatment coating 80 is formed, which is made up of Ni film 82, Pb film 84 and Au film 86 (FIG. 12). FIG. 14C shows a magnified view of surface-treatment coating 80 in FIG. 12.

Third Embodiment

Figure 15:
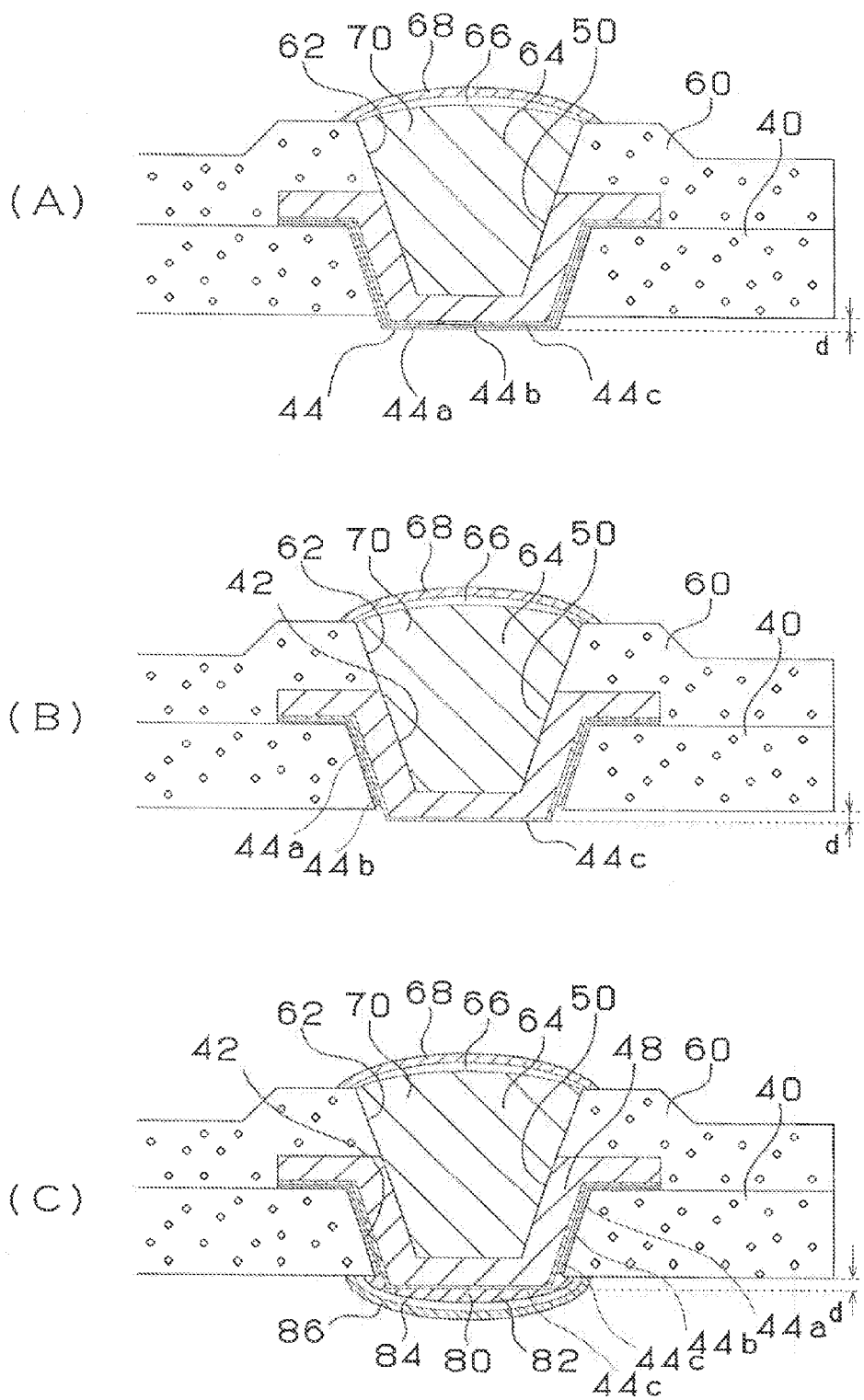
FIGS. 15(A)-15(C) are views of the manufacturing steps shown by magnifying a via conductor and a bump in a printed wiring board of the third embodiment.

A method for manufacturing a printed wiring board according to the third embodiment is described with reference to FIG. 15.

In the first embodiment, after removing the thermoplastic resin, etching was conducted to remove Ti-sputtered film (44b) and TiN-sputtered film (44a) exposed through opening 42 in interlayer resin insulation layer 40. Then, the surface of first interlayer resin insulation layer 40 was polished by sandblasting. By contrast, in the third embodiment, after removing the thermoplastic resin as shown in FIG. 8C in the first embodiment, the surface of first interlayer resin insulation layer 40 is polished by sandblasting (FIG. 15A). After that, Ti-sputtered film (44b) and TiN-sputtered film (44a) exposed through opening 42 in interlayer resin insulation layer 40 are removed (FIG. 15B).

Then, after Ni film 82 is formed by electroless plating on Cu-sputtered film (44c) on the bottom portion of via conductor 50, Pb film 84 and Au film 86 are formed in that order by electroless plating, and surface-treatment coating 80 is formed (FIG. 15C).

In the third embodiment, as shown in FIG. 15B, Ti-sputtered film (44b) and TiN-sputtered film (44a) are removed up to the interior portion between opening 42 and Cu-sputtered film (44c), and Ni film 82 of surface-treatment coating 80 enters the space formed by such a removal as shown in FIG. 15C. Accordingly, adhesiveness may be enhanced between via conductor 50 and surface-treatment coating 80.

Fourth Embodiment

In the fourth embodiment, electroless copper-plated film is used as the first conductive layer. Namely, via conductor 50 is made up of electroless copper-plated film formed on the side wall of interlayer resin insulation layer 40, and of electrolytic plated film filled in opening 42. Here, when removing electroless copper-plated film on the bottom side (first-surface side) of a via conductor, for example, spraying an etchant is thought to be an option. However, the removal method is not limited specifically. In the present embodiment, the same functions and effects may be achieved as in the first embodiment.

Fifth Embodiment

In the fifth embodiment, a non-photosensitive interlayer resin insulation layer is used. In such a case, a via conductor opening is formed by a laser. During that time, it is preferred to form an opening up to the middle of a removal layer positioned under the interlayer resin insulation layer. In doing so, when a support substrate is removed after a wiring layer is formed by forming a via conductor inside the opening, the first surface of the via conductor will protrude from the second surface of the interlayer resin insulation layer, the same as in the first embodiment. In the fifth embodiment, the same effects may also be achieved as in the above first embodiment.

In a printed wiring board having a surface-treatment coating formed on the surface of the via conductor exposed through the penetrating hole, a via conductor is formed with a surface protruding from one surface of an interlayer resin insulation layer, an anchoring effect is achieved with a surface-treatment coating formed on the surface of the via conductor, and adhesiveness is improved between the via conductor and the surface-treatment coating. The via conductor may be made of a first conductive layer formed on a side wall of the penetrating hole and of a plated layer filling the penetrating hole.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
   forming a removable layer on a support substrate;
   forming an interlayer resin insulation layer on the removable layer;
   forming a penetrating hole in the interlayer resin insulation layer;
   forming a first conductive layer on the interlayer resin insulation layer and on a side wall of the penetrating hole;
   forming a conductive circuit on the interlayer resin insulation layer;
   forming a via conductor in the penetrating hole;
   removing the support substrate from the interlayer resin insulation layer by using the removable layer;
   reducing a thickness of the interlayer resin insulation layer such that a portion of the via conductor protrudes from a surface of the interlayer resin insulation layer and forms a protruding portion protruding from the surface of the interlayer resin insulation layer; and
   forming a surface-treatment coating on a surface of the protruding portion of the via conductor.

2. The method for manufacturing a printed wiring board according to claim 1, wherein the forming of the protruding portion of the via conductor comprises sandblasting the interlayer resin insulation layer such that the thickness of the interlayer resin insulation layer is reduced until the portion of the via conductor protrudes from the surface of the interlayer resin insulation layer.

3. The method for manufacturing a printed wiring board according to claim 2, wherein the removing of the support substrate from the interlayer resin insulation layer comprises applying heat to the removable layer such that the support substrate is removed and ashing the removable layer from the interlayer resin insulation layer.

4. The method for manufacturing a printed wiring board according to claim 2, wherein the removable layer is made of a thermoplastic resin, and the removing of the support substrate from the interlayer resin insulation layer comprises applying heat to the removable layer such that the support substrate is removed and ashing the removable layer from the interlayer resin insulation layer.

5. The method for manufacturing a printed wiring board according to claim 2, wherein the forming of the via conductor comprises forming a second conductive layer on the first conductive layer in the penetrating hole and forming a plated metal layer on the second conductive layer, and the second conductive layer and the plated layer are made of a same metal.

6. The method for manufacturing a printed wiring board according to claim 2, wherein the forming of the via conductor comprises forming a second conductive layer on the first conductive layer in the penetrating hole and forming a plated metal layer on the second conductive layer, and the second conductive layer and the plated layer are made of copper.

7. The method for manufacturing a printed wiring board according to claim 1, wherein the forming of the via conductor comprises forming a second conductive layer on the first conductive layer in the penetrating hole.

8. The method for manufacturing a printed wiring board according to claim 1, wherein the forming of the via conductor comprises forming a second conductive layer on the first conductive layer in the penetrating hole and forming a plated metal layer on the second conductive layer, and the second conductive layer and the plated layer are made of a same metal.

9. The method for manufacturing a printed wiring board according to claim 1, wherein the forming of the via conductor comprises forming a second conductive layer on the first conductive layer in the penetrating hole and forming a plated metal layer on the second conductive layer, and the second conductive layer and the plated layer are made of copper.

10. The method for manufacturing a printed wiring board according to claim 1, wherein the forming of the protruding portion of the via conductor comprises removing a portion of the first conductive layer protruding from the surface of the interlayer resin insulation layer before the forming of the surface-treatment coating.

11. The method for manufacturing a printed wiring board according to claim 1, wherein the removable layer is made of a thermoplastic resin.

12. The method for manufacturing a printed wiring board according to claim 11, wherein the removing of the support substrate from the interlayer resin insulation layer comprises applying heat to the removable layer such that the support substrate is removed and ashing the removable layer from the interlayer resin insulation layer.

13. The method for manufacturing a printed wiring board according to claim 1, wherein the forming of the first conductive layer comprises sputtering a TiN film and sputtering a Ti film after the sputtering of the TiN film on the interlayer resin insulation layer.

14. The method for manufacturing a printed wiring board according to claim 13, wherein the forming of the surface-treatment coating comprises forming a Ni film on the surface of the protruding portion of the via conductor, forming a Pd film on the Ni film and forming a Au film on the Pd film such that the surface-treatment coating covers the surface of the protruding portion of the via conductor.

15. The method for manufacturing a printed wiring board according to claim 13, wherein the surface-treatment coating comprises a Ni film, a Pd film and a Au film.

16. The method for manufacturing a printed wiring board according to claim 1, wherein the conductive circuit and the via conductor are formed at a same time.

17. The method for manufacturing a printed wiring board according to claim 16, wherein the forming of the conductive circuit and the forming of the via conductor are carried out by a semi-additive method.

18. The method for manufacturing a printed wiring board according to claim 1, wherein the forming of the surface-treatment coating comprises forming a Ni film on the surface of the protruding portion of the via conductor, forming a Pd film on the Ni film and forming a Au film on the Pd film such that the surface-treatment coating covers the surface of the protruding portion of the via conductor.

19. The method for manufacturing a printed wiring board according to claim 1, wherein the surface-treatment coating comprises a Ni film, a Pd film and a Au film.

20. The method for manufacturing a printed wiring board according to claim 1, wherein the removing of the support substrate from the interlayer resin insulation layer comprises applying heat to the removable layer such that the support substrate is removed and ashing the removable layer from the interlayer resin insulation layer.

* * * * *